United States Patent
Takahashi

(10) Patent No.: US 8,729,545 B2
(45) Date of Patent: May 20, 2014

(54) SEMICONDUCTOR MEMORY DEVICE

(75) Inventor: Yasuyuki Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 12 days.

(21) Appl. No.: 13/454,437

(22) Filed: Apr. 24, 2012

(65) Prior Publication Data

US 2012/0273858 A1    Nov. 1, 2012

(30) Foreign Application Priority Data

Apr. 28, 2011   (JP) .................. 2011-101468

(51) Int. Cl.
*H01L 27/108*   (2006.01)
*H01L 29/26*    (2006.01)
*G11C 7/12*     (2006.01)
*G11C 7/16*     (2006.01)

(52) U.S. Cl.
CPC ............ *H01L 29/263* (2013.01); *H01L 27/108* (2013.01); *G11C 7/12* (2013.01); *G11C 7/16* (2013.01)
USPC ............................................. 257/43; 257/90

(58) Field of Classification Search
CPC .......... G11C 7/12–7/16; H01L 27/108; H01L 29/263
USPC ................ 257/68–70, 296–308, 905–907, 43
See application file for complete search history.

(56) References Cited

U.S. PATENT DOCUMENTS 4,466,081 A    8/1984  Masuoka
5,349,366 A    9/1994  Yamazaki et al.
5,712,817 A    1/1998  Suh
5,731,856 A    3/1998  Kim et al.

(Continued)

FOREIGN PATENT DOCUMENTS

EP    1 737 044 A1    12/2006
EP    2 226 847 A2     9/2010

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

(Continued)

*Primary Examiner* — Michael Lebentritt
(74) *Attorney, Agent, or Firm* — Fish & Richardson P.C.

(57) ABSTRACT

An object is to provide a semiconductor memory device that enables low power consumption of a memory cell of a CAM including a nonvolatile memory device. Another object is to provide a semiconductor memory device without degradation due to repeated data writing. Still another object is to provide a nonvolatile memory device that enables high density of memory cells. A semiconductor memory device is provided which includes a memory circuit including a first transistor including an oxide semiconductor in a semiconductor layer, and a capacitor in which a potential corresponding to written data can be retained by turning off the first transistor; and a reference circuit for referring the written potential. The semiconductor memory device enables a high-speed search function by obtaining the address of data generated by detecting the conducting state of a second transistor in the reference circuit.

18 Claims, 14 Drawing Sheets

(56) References Cited

U.S. PATENT DOCUMENTS

| | | |
|---|---|---|
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,304,477 B1 | 10/2001 | Naji |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,106 B2 | 8/2010 | Chang |
| 8,415,731 B2 | 4/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0117394 A1* | 6/2005 | Nozawa et al. .......... 365/185.08 |
| 2005/0169040 A1* | 8/2005 | Peng et al. .................... 365/149 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0002608 A1 | 1/2007 | Hsu et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0207253 A1* | 8/2010 | Moriwaka .................... 257/628 |
| 2011/0089414 A1* | 4/2011 | Yamazaki et al. .............. 257/43 |
| 2011/0101334 A1 | 5/2011 | Yamazaki et al. |
| 2011/0182110 A1 | 7/2011 | Yamazaki et al. |
| 2011/0216571 A1* | 9/2011 | Yamazaki et al. .............. 365/72 |
| 2012/0262979 A1 | 10/2012 | Matsubayashi |
| 2013/0140558 A1* | 6/2013 | Yamazaki et al. .............. 257/43 |
| 2013/0141961 A1* | 6/2013 | Matsuzaki .................... 365/149 |
| 2013/0308392 A1* | 11/2013 | Nishijima et al. ....... 365/189.02 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-525473 A | 8/2004 |
| JP | 2004-273614 A | 9/2004 |
| JP | 2004-273732 A | 9/2004 |
| JP | 2008-545221 A | 12/2008 |
| WO | 2004/114391 A1 | 12/2004 |

OTHER PUBLICATIONS

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

(56) References Cited

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with English translation).

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates D et al., "Optical Studies of the Amorphous Liquid-Cholesteric Liquid Crystal Transition: the Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology,"SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

(56) References Cited

OTHER PUBLICATIONS

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

T1

T2

● In
☾ Sn
☽ Zn
• O

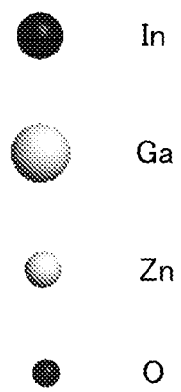

SEMICONDUCTOR MEMORY DEVICE

BACKGROUND OF THE INVENTION

1. Field of the Invention

The present invention relates to a semiconductor memory device, particularly to a semiconductor memory device that enables high-speed search of data to be searched stored in the semiconductor memory device.

2. Description of the Related Art

A content addressable memory (hereinafter called CAM) is a semiconductor memory device that enables high-speed search by obtaining the address of data generated by comparing stored data with data to be searched, unlike a semiconductor memory device in which stored data is read by addressing.

Examples of CAMs include a structure using a volatile memory device as described in Patent Document 1. In a CAM using a volatile memory device, stored data is lost when the supply of a supply voltage is stopped. Particularly in mobile devices which cannot be easily supplied with the supply voltage stably, the loss of data caused by stopping the supply of the supply voltage causes inconvenience.

In view of the foregoing problem, in recent years, a CAM using a nonvolatile memory device as described in Patent Document 2 has been proposed. Patent Document 2 discloses a CAM in which a nonvolatile memory device formed using a phase change material is used to prevent data from being lost when the supply of a supply voltage is stopped.

REFERENCE

Patent Document

[Patent Document 1] Japanese Published Patent Application No. 2004-525473
[Patent Document 2] Japanese Translation of PCT International Application 2008-545221

SUMMARY OF THE INVENTION

However, in a CAM using a nonvolatile memory device formed using a phase change material, it is necessary to promote phase change of the phase change material due to heat by feeding current to the phase change material when data is written.

To the CAM including a nonvolatile memory device, to which data is written by feeding current, data cannot be easily written by feeding current to a plurality of memory cells at a time. Further, an additional circuit for generating current used to write data needs to be provided in the CAM. This poses a problem of increased power consumption.

Moreover, the CAM including a nonvolatile memory device to which data is written by feeding current has a problem of degradation due to repeated writing.

Furthermore, the CAM including a nonvolatile memory device to which data is written by feeding current requires heat generation when data is written. This poses a problem of difficulty in increasing the density of the memory circuits.

Therefore, it is an object of one embodiment of the present invention to provide a semiconductor memory device that enables low power consumption of a memory cell of a CAM including a nonvolatile memory device. It is another object of one embodiment of the present invention to provide a semiconductor memory device without degradation due to repeated data writing. It is still another object of one embodiment of the present invention to provide a nonvolatile memory device that enables high density of memory cells.

One embodiment of the present invention is a semiconductor memory device that includes a memory circuit including a first transistor including an oxide semiconductor in a semiconductor layer, and a capacitor in which a potential corresponding to written data can be retained by turning off the first transistor; and a reference circuit for referring the written potential. The semiconductor memory device enables high-speed search by obtaining the address of data generated by detecting the conducting state of a second transistor in the reference circuit.

One embodiment of the present invention is a semiconductor memory device including a plurality of memory cells each including a memory circuit and a reference circuit. The memory circuit includes a first transistor including a first terminal electrically connected to a bit line, and a gate electrically connected to a word line, and an oxide semiconductor in a semiconductor layer; and a capacitor having a first electrode electrically connected to a second terminal of the first transistor, and a second electrode electrically connected to a data line. The reference circuit includes a second transistor having a gate electrically connected to the second terminal of the first transistor and to the first electrode of the capacitor. The plurality of memory cells is arranged in a direction in which the bit line is extended and in a direction in which the word line is extended. The first terminal and the second terminal of the second transistors in the memory cells adjacent in the direction in which the word line is extended are electrically connected in series, and the second transistors electrically connected in series are electrically connected to a determination circuit.

In one embodiment of the present invention, the second transistor preferably includes single crystal silicon in a semiconductor layer.

In one embodiment of the present invention, the first transistor and the second transistor are preferably provided so as to form a layered structure.

In one embodiment of the present invention, the second transistor preferably includes an oxide semiconductor in a semiconductor layer.

In one embodiment of the present invention, the semiconductor layer of the first transistor and the semiconductor layer of the second transistor are preferably provided in an identical layer.

In one embodiment of the present invention, the determination circuit is preferably used for detecting a change in potential caused in accordance with conducting states or non-conducting states of the second transistors connected in series.

According to one embodiment of the present invention, a CAM including a nonvolatile memory device that consumes low power can be achieved. According to one embodiment of the present invention, degradation due to repeated data writing can be prevented. According to one embodiment of the present invention, high density of memory cells can be achieved.

DETAILED DESCRIPTION OF THE INVENTION

Figure 1A:
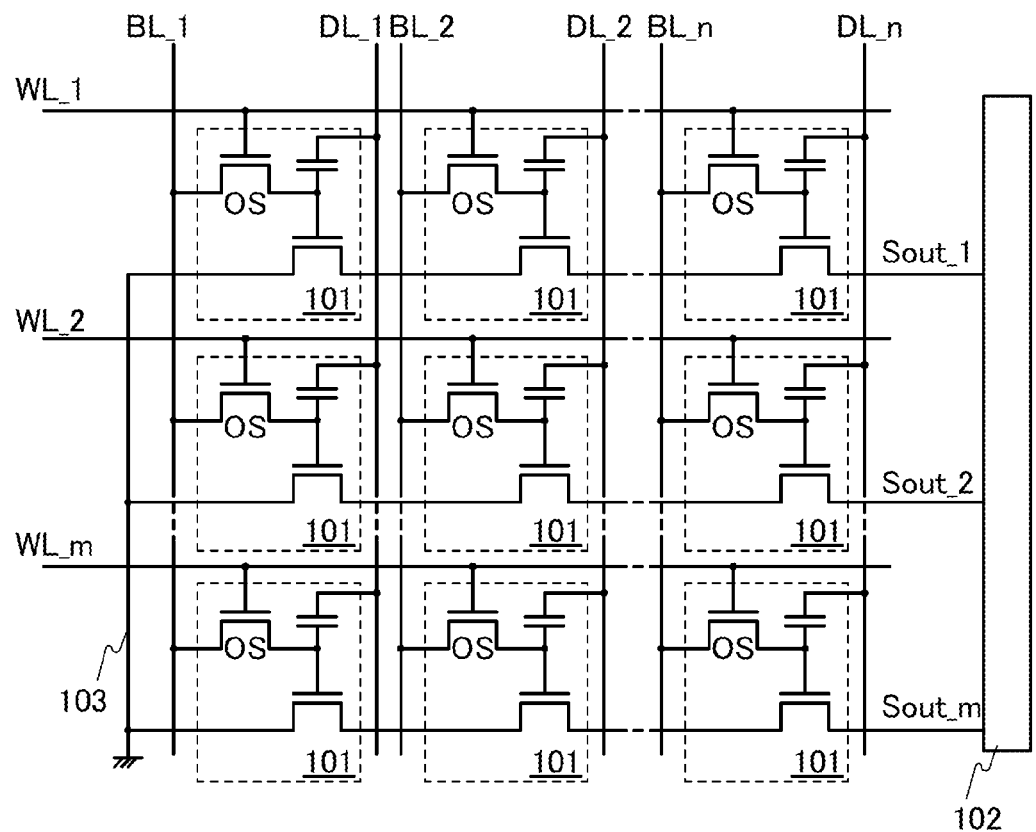
FIGS. 1A and 1B are circuit diagrams illustrating an example of a semiconductor memory device.

Hereinafter, embodiments of the present invention will be described in detail with reference to the accompanying drawings. However, the present invention is not limited to the description below, and it is easily understood by those skilled in the art that modes and details disclosed herein can be modified in various ways. Further, the present invention is not construed as being limited to the description of the embodiments below. Through the drawings, similar components are denoted by similar numerals in the following description.

Note that the size, the thickness of a layer, signal waveform, and a region in structures illustrated in the drawings and the like in the embodiments are exaggerated for simplicity in some cases. Therefore, the scale is not necessarily limited to that illustrated in the drawings and the like.

Note that in this specification, the terms "first", "second", "third", and "N-th" (N is a natural number) are used in order to avoid confusion between components and thus do not limit the number of the components.

Note that in this specification, regions which function as a source and a drain of a transistor are referred to as first terminal and second terminal, respectively, without distinguishing them by the level of potential. Alternatively, one of the source and the drain may be referred to as first electrode and the other may be referred to as second electrode. Alternatively, one of the source and the drain may be referred to as source region and the other may be referred to as drain region.

Note that in this specification, when it is explicitly described that "A and B are connected", the case where A and B are electrically connected, the case where A and B are functionally connected, and the case where A and B are directly connected are included therein. Specifically, the description "A and B are connected" includes the case where a portion between A and B can be regarded as one node in consideration of circuit operation, for example, the case where A and B are connected through a switching element such as a transistor and have the same or substantially the same potentials by conduction of the switching element, and the case where A and B are connected through a resistor and the potential difference generated at opposite ends of the resistor does not adversely affect the operation of a circuit including A and B.

Embodiment 1

Figure 1B:
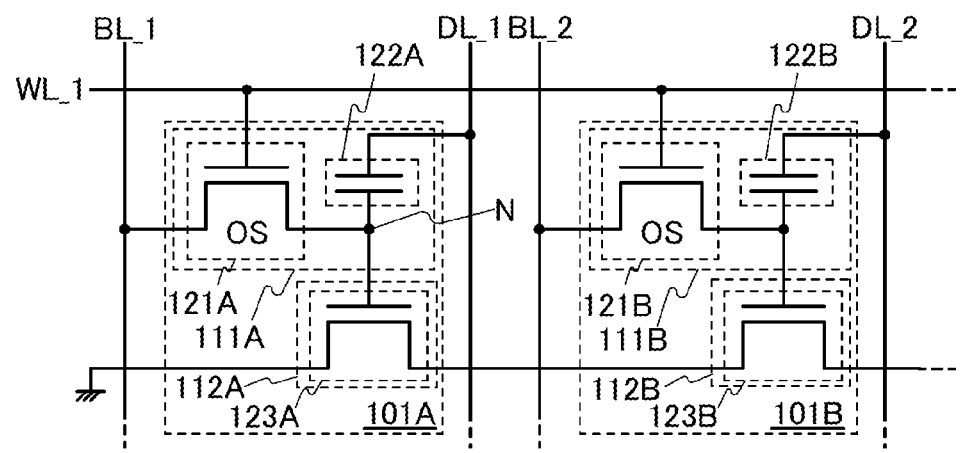

This embodiment describes the structure of a semiconductor memory device that can act as a CAM with reference to FIGS. 1A and 1B.

FIG. 1A is a circuit diagram of a semiconductor memory device including m rows and n columns (m and n are natural numbers) of memory cells. The semiconductor memory device in FIG. 1A includes bit lines BL_1 to BL_n, word lines WL_1 to WL_m, data lines DL_1 to DL_n, a plurality of memory cells 101, and a determination circuit 102.

The memory cell 101 is connected to any one of the bit lines BL_1 to BL_n, any one of the word lines WL_1 to WL_m, and any one of the data lines DL_1 to DL_n. In addition, memory cells 101 are connected in the row direction, that is, the direction in which the word lines WL_1 to WL_m are extended. One terminal of each of output signal lines Sout_1 to Sout_m is connected to the determination circuit 102, and the other terminal is connected to a common power supply line 103 (a GND line in FIG. 1A).

The determination circuit 102 is a circuit for detecting the potentials of the output signal lines Sout_1 to Sout_m. These potentials change according to the conducting state or non-conducting state of the memory cells connected in the direction in which the word lines WL_1 to WL_m are extended.

FIG. 1B illustrates the structure of the memory cell 101 in FIG. 1A. Note that as illustrated in FIG. 1A, the memory cells 101 are arranged in a matrix (in the direction in which the bit lines are extended (the column direction in FIG. 1A) and the direction in which the word lines are extended (the row direction in FIG. 1A)). A description is given with reference to FIG. 1B, taking the memory cell in the first row and the first column (a memory cell 101A) and the memory cell in the first row and the second column (a memory cell 101B) as an example of adjacent memory cells among the memory cells 101 in FIG. 1A.

The memory cell 101A in FIG. 1B is composed of a memory circuit 111A including a first transistor 121A and a capacitor 122A, and a reference circuit 112A including a second transistor 123A.

A first terminal of the first transistor 121A is connected to the bit line BL_1. A gate of the first transistor 121A is connected to the word line WL_1. A first electrode of the capacitor 122A is connected to a second terminal of the first transistor 121A. A second electrode of the capacitor 122A is connected to the data line DL_1. A first terminal of the second transistor 123A is connected to the power supply line 103. A gate of the second transistor 123A is connected to the second terminal of the first transistor 121A and the first electrode of the capacitor 122A.

The memory cell 101B in FIG. 1B is composed of a memory circuit 111B including a first transistor 121B and a capacitor 122B, and a reference circuit 112B including a second transistor 123B.

A first terminal of the first transistor 121B is connected to the bit line BL_2. A gate of the first transistor 121B is connected to the word line WL_1. A first electrode of the capacitor 122B is connected to a second terminal of the first transistor 121B. A second electrode of the capacitor 122B is connected to the data line DL_2. A first terminal of the second transistor 123B is connected to the second terminal of the second transistor 123A. A gate of the second transistor 123B is connected to the second terminal of the first transistor 121B and the first electrode of the capacitor 122B.

Note that the reference circuits 112A and 112B are connected in series so that the first terminal of the second transistor 123B and the second terminal of the second transistor 123A which are in adjacent memory cells are connected in the direction in which the word lines are extended. In other words, the first terminal of the second transistor 123B and the second terminal of the second transistor 123A are connected in series in the direction in which the word lines are extended; the first terminals of the second transistors 123A in the first column are connected to the power supply line 103, and the second terminals of the second transistors 123B in the n-th column are connected to the determination circuit 102 via the respective output signal lines Sout_1 to Sout_m.

Therefore, the conducting state of the second transistor included in the reference circuit determines conduction between each of the output signal lines Sout_1 to Sout_m and the power supply line 103. When the second transistors in each column are all brought into the conducting state, conduction between each of the output signal lines Sout_1 to Sout_m and the power supply line 103 is established. In contrast, when at least one of the second transistors in each column is brought into the nonconducting state, conduction between each of the output signal lines Sout_1 to Sout_m and the power supply line 103 is broken.

The semiconductor memory device compares data stored in memory cells with data to be searched by detection of the conducting states of the second transistors in the reference circuits in the memory cells. The semiconductor memory device thereby obtains the address of data generated in the determination circuit 102, and thus enables high-speed search.

In this embodiment, data stored in memory cells that identifies data to be searched is searched by detecting the conducting states or nonconducting states of the second transistors in the reference circuits in the memory cells. Therefore, stored data is preferably such data that changes the conducting state or nonconducting state of any of the second transistors in the reference circuits when data to be searched is input to the memory cells.

Note that data to be searched is input to each memory cell via the data lines DL_1 to DL_n. The potentials of the data lines DL_1 to DL_n are changed in accordance with the data to be searched. In accordance with this change in potential, the capacitors in the memory cells change the potentials of the gates of the second transistors by capacitive coupling. Then, the conducting states or nonconducting states of the second transistors are controlled. Thus, the address of data generated in the determination circuit 102 can be obtained.

Note that in this embodiment, the first transistor 121A in the memory circuit 111A and the first transistor 121B in the memory circuit 111B are transistors with a low off-state current. Specifically, they may be transistors having a semiconductor layer comprising an oxide semiconductor which is highly purified, has a band gap of 2.5 eV or higher, a semiconductor layer comprising silicon carbide, a semiconductor layer comprising gallium nitride, or the like. The above-described semiconductor layer has a wide band gap and a small number of impurity levels, so that recombination of carriers is hardly caused and the off-state current is small.

In the structure described in this embodiment, the semiconductor layers in the first transistors are preferably formed using a highly purified oxide semiconductor with a band gap of 2.5 eV or more. Here, a highly purified oxide semiconductor refers to an oxide semiconductor in which an impurity such as hydrogen is sufficiently removed or to which oxygen is sufficiently supplied. Specifically, the concentration of hydrogen in the oxide semiconductor is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower, for example. Note that the above concentration of hydrogen in the oxide semiconductor is measured by secondary ion mass spectrometry (SIMS).

Note that the first transistors 121A and 121B in FIGS. 1A and 1B are transistors whose channel is formed in a semiconductor layer including an oxide semiconductor. In drawings, "OS" is written in order to indicate that the first transistors 121A and 121B are transistors whose channel is formed in a semiconductor layer including an oxide semiconductor.

The carrier concentration of the oxide semiconductor, in which hydrogen is reduced to a sufficiently low concentration so that the oxide semiconductor is purified and in which defect states in an energy gap due to oxygen deficiency are reduced by sufficiently supplying oxygen, is lower than $1 \times 10^{12}$ atoms/cm$^3$, preferably lower than $1 \times 10^{11}$ atoms/cm$^3$, further preferably lower than $1.45 \times 10^{10}$ atoms/cm$^3$. For example, the off-state current (per unit channel width (1 μm) here) at room temperature is 100 zA/μm (1 zA (zeptoampere) is $1 \times 10^{-21}$ A) or less, preferably 10 zA/μm or less. The first transistor with very excellent off-state current characteristics can be obtained with the use of such an i-type (intrinsic) or substantially i-type oxide semiconductor.

The first transistor with excellent off-state current characteristics can be substantially considered as an insulator when being in the nonconducting state. Therefore, the use of the first transistor in the memory circuit can reduce a decrease in the potential retained in a node connected to the capacitor and the first transistor (a node N in FIG. 1B) to a very low level. This enables a nonvolatile memory circuit in which, even if the supply of the supply voltage is stopped, changes in the potential of the node N can be reduced and the loss of stored data can be prevented.

Note that retained data is rewritten by setting the potentials of the word lines to potentials by which the first transistors are brought into the conducting state and giving the potentials of the bit lines to the nodes N at a time. Thus, data can be rewritten not by retaining data by feeding current directly to elements but by giving the potentials of the bit lines to the nodes N via the first transistors. For this reason, unlike in a structure in which a plurality of memory cells is rewritten by feeding current, high current is not needed for rewriting data to a plurality of memory cells. In other words, a plurality of memory cells can be rewritten at a time.

Data in the memory circuits in the semiconductor memory device in this embodiment is not rewritten by current, which eliminates a circuit for generating current needed for rewriting from peripheral circuits for the semiconductor memory device. Therefore, elimination of a circuit for generating current needed for rewriting leads to a corresponding reduction in power consumption. Thus, according to one embodiment of the present invention, low power consumption is achieved in a CAM including a nonvolatile memory device.

As described above, in the semiconductor memory device in this embodiment, data rewriting is achieved by retention of a potential in the node. Therefore, the memory circuit according to this embodiment can, in principle, prevent degradation of a memory element to which data is repeatedly rewritten. Thus, according to one embodiment of the present invention, unlike in a nonvolatile memory circuit in which data is written by feeding current, degradation due to repeated data writing can be prevented.

Moreover, the semiconductor memory device in this embodiment does not require high current for writing data to the memory circuits. Therefore, heat due to current flow is not significant, and elements in the memory circuits can be composed of transistors and capacitors which can be reduced in size and form a layered structure. Thus, in one embodiment of the present invention, high density of the memory cells can be achieved.

Although this embodiment has given a description on the assumption that the first transistors are n-channel transistors, the first transistors may be p-channel transistors instead. Here, the nature of a technique described in this embodiment is the first transistors with a low off-state current. Therefore, a material for semiconductor layers in the first transistors is not limited to an oxide semiconductor, and may be a semiconductor that results in a transistor with a low off-state current.

This embodiment can be implemented in appropriate combination with any of the other embodiments.

Embodiment 2

This embodiment shows a specific structure of the semiconductor memory device in Embodiment 1 which can act as a CAM, and examples of the structure and operation of the semiconductor memory device with reference to FIG. 2, FIGS. 3A and 3B, FIGS. 4A and 4B, and FIGS. 5A and 5B.

Figure 2:
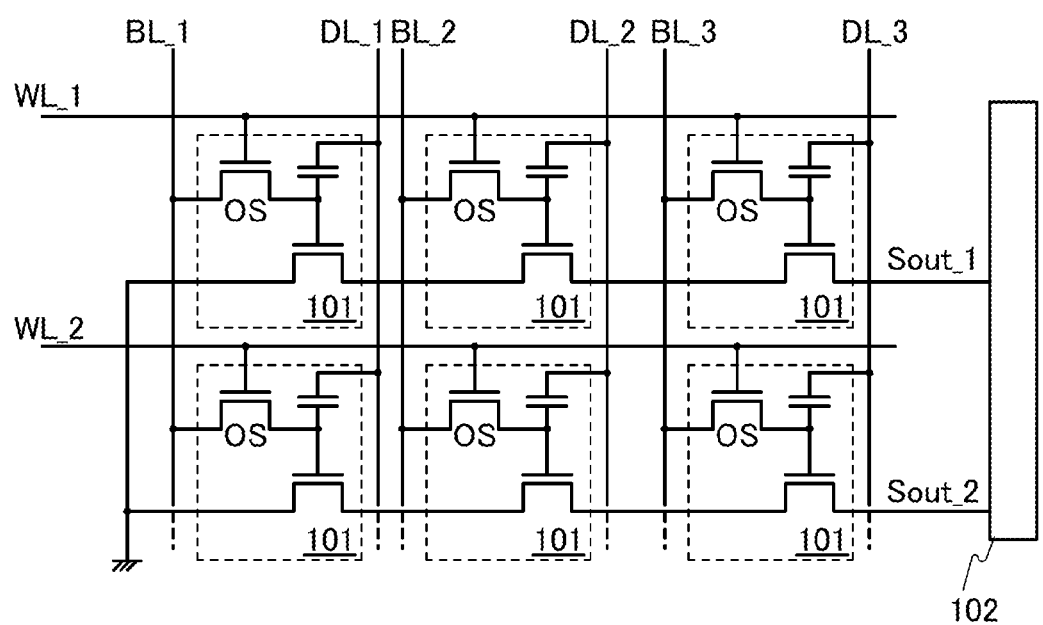
FIG. 2 is a circuit diagram illustrating an example of a semiconductor memory device.

FIG. 2 is a circuit diagram of a semiconductor memory device including two rows and three columns of memory cells, which is shown as an example of the semiconductor memory device in FIG. 1A. The semiconductor memory device in FIG. 2 includes bit lines BL_1 to BL_3, word lines WL_1 and WL_2, data lines DL_1 to DL_3, two rows and three columns of memory cells 101, and the determination circuit 102. Connections between each memory cell 101 and the lines, and the circuit configuration of the memory cells are similar to those in FIGS. 1A and 1B.

Figure 3A:
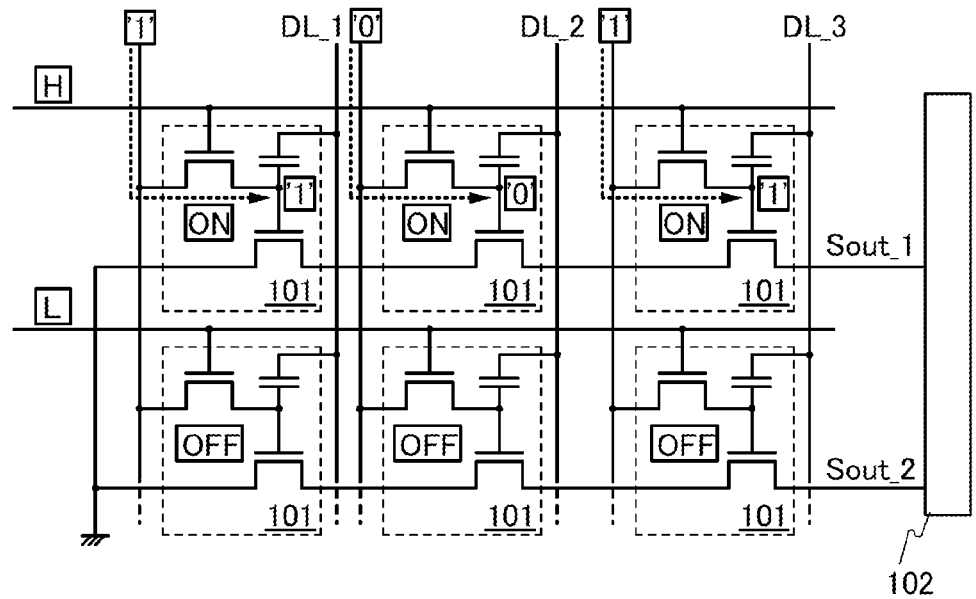
FIGS. 3A and 3B are circuit diagrams illustrating an example of a semiconductor memory device.
Figure 3B:
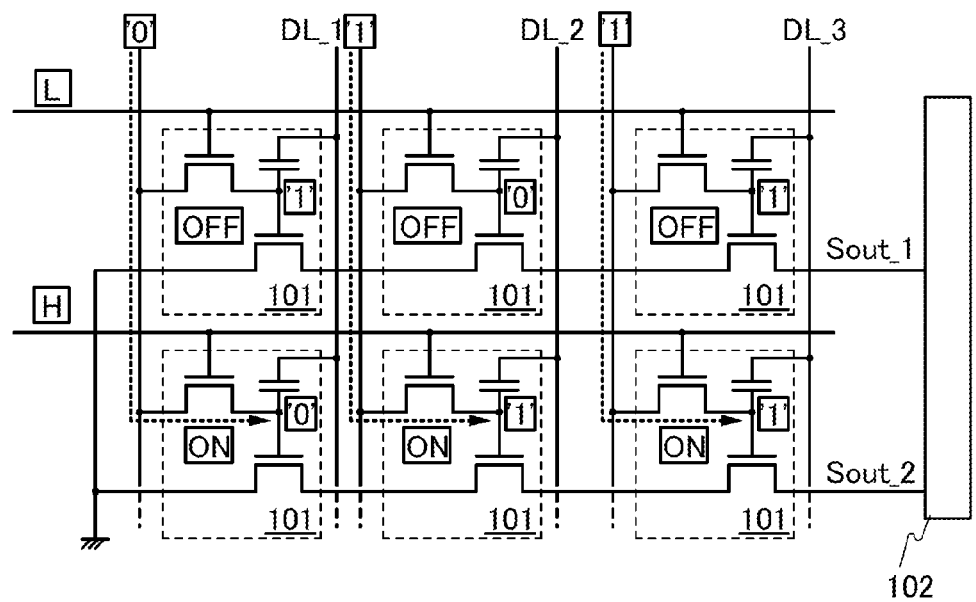

Next, a description is given with reference to FIGS. 3A and 3B of an operation for writing data to each row in the semiconductor memory device illustrated in FIG. 2. Note that data '1' or data '0' written to the node N in each memory cell is a signal written by the level of a potential. Note that in this embodiment, data '1' is a potential that can bring the second transistor into the conducting state when being retained in the node N. Further, in this embodiment, the description is given on the assumption that data '0' is a potential that can bring the second transistor into the nonconducting state when being retained in the node N.

FIG. 3A illustrates an operation in which data '1' is written to the memory cell in the first row and the first column, data '0' is written to the memory cell in the first row and the second column, and data '1' is written to the first row and the third column. As described in Embodiment 1, data is rewritten in the following manner. The potential of the word line WL_1 that corresponds to a row to which data is written is set to an H level (a voltage level that brings the first transistor into the conducting state) to write a potential corresponding to the data to the nodes N in one row at a time (see dotted arrows in FIG. 3A). Note that the potential of the word line WL_2 that corresponds to a row to which data is not written is set to an L level (a voltage level that brings the first transistor into the nonconducting state) so that a potential corresponding to the data is not written to the nodes N in the memory cells in that row.

FIG. 3B illustrates an operation in which data '0' is written to the memory cell in the second row and the first column, data '1' is written to the memory cell in the second row and the second column, and data '1' is written to the second row and the third column. As described in Embodiment 1, data is rewritten in the following manner. The potential of the word line WL_2 that corresponds to a row to which data is written is set to an H level to write a potential corresponding to the data to the nodes N in one row at a time (see dotted arrows in FIG. 3B). Note that the potential of the word line WL_1 that corresponds to a row to which data is not written is set to an L level so that a potential corresponding to data is not written to the nodes N in the memory cells in that row. At this time, even if the supply of the supply voltage is stopped, the memory cells in the first row to which data has already been written can retain the data with the first transistors in the nonconducting state.

As illustrated in FIGS. 3A and 3B, data '101' is stored in the memory cells in the first row in the direction in which the word lines are extended, while data '011' is stored in the memory cells in the second row in the direction in which the word lines are extended.

Next, a description is given with reference to a circuit diagram and a timing chart of an operation of the semiconductor memory device in which data stored in memory cells is compared with data to be searched by detection of the conducting states of the second transistors in the reference circuits in the memory cells to obtain the address of the data generated in the determination circuit 102.

Figure 4A:
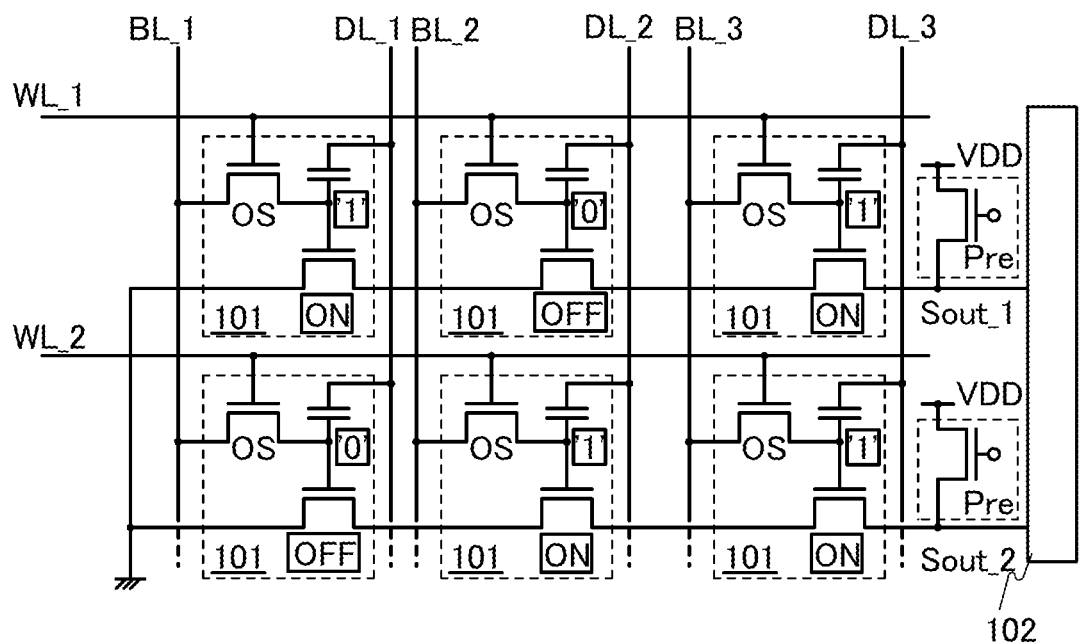
FIGS. 4A and 4B are a circuit diagram and a timing chart illustrating an example of a semiconductor memory device.

Note that the following shows an example of an operation in which data written to the two rows and three columns of memory cells as illustrated in FIGS. 3A and 3B is read as illustrated in FIG. 4A.

Moreover, FIG. 4A illustrates a structure in which a precharge circuit Pre (not illustrated in FIG. 1A) is connected to each of the output signal lines Sout_1 and Sout_2. The precharge circuit Pre is a circuit for increasing the potentials of the output signal lines Sout_1 and Sout_2 before data is read. A function of the precharge circuit Pre may instead be achieved by the determination circuit 102.

Figure 4B:
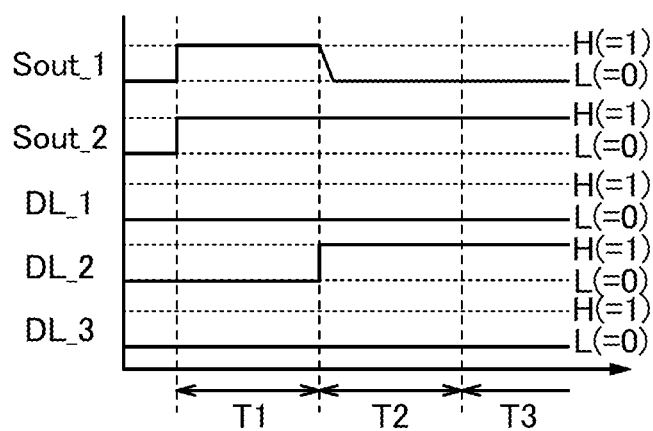

Next, the timing chart of FIG. 4B is described. In the timing chart of FIG. 4B, a period T1, a period T2, and a period T3 are a precharge period, a data search period, and a data output period, respectively.

Figure 5A:
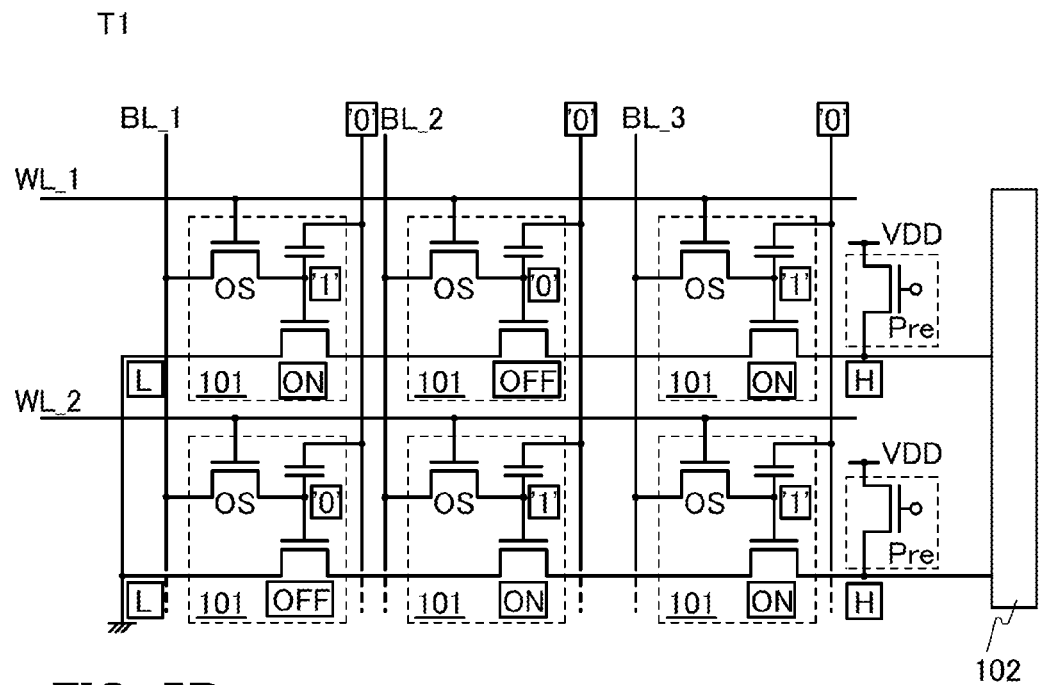
FIGS. 5A and 5B are circuit diagrams illustrating an example of a semiconductor memory device.

The precharge period which is the period T1 is described. Before data is read, the potentials of the output signal lines Sout_1 and Sout_2 are increased in advance by the precharge circuit Pre. At this time, data '0' is input to all the data lines DL_1 to DL_3. The states of the signals at the lines in the period T1 are illustrated in FIG. 5A. As illustrated in FIG. 5A, at least one of the second transistors in the reference circuits arranged in the direction in which the word lines are extended is in the nonconducting state, so that current does not flow between the power supply line 103 and the output signal line Sout_1 or Sout_2.

Next, the data search period which is the period T2 is described. Note that in this embodiment, the case where data to be searched is '101' is described.

Figure 5B:
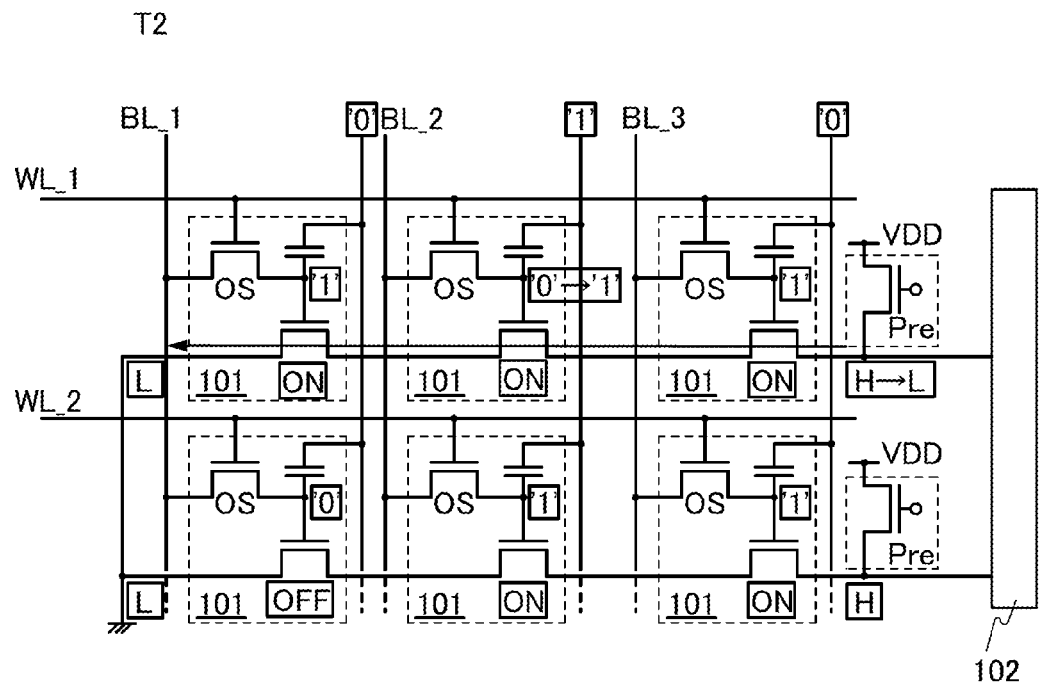

When data '101' is searched, data '0', data '1', and data '0' are input to the data line DL_1 in the first column, the data line DL_2 in the second column, and the data line DL_3 in the third column, respectively. In other words, data having a potential obtained by inverting the potential of data to be searched is input through the data line. Consequently, in each of the memory cells to which data '1' is input through the data line, the potential of the node N is increased by capacitive coupling through the capacitor in the memory circuit, so that the second transistor in the reference circuit is brought into the conducting state. In the case where the second transistor has already been in the conducting state since before the period T2, even an increase in the potential of the node N due to capacitive coupling via the capacitor in the memory circuit does not change the conducting state of the second transistor. The states of the signals at the lines in the period T2 are illustrated in FIG. 5B.

As described above, the conducting state of the second transistor in the reference circuit is changed by changing the potential of the data line. In the memory cells in the first row to which data to be searched '101' has already been written, the second transistors arranged in the direction in which the word line WL_1 is extended are all brought into the conducting state by a change in the potential of the data line. Consequently, potential difference is generated between the output signal line Sout_1 and the power supply line 103 between which conduction has been established, causing current to be flown therebetween (see a solid arrow in FIG. 5B), so that the potential that has been increased in advance in the period T1 drops.

On the other hand, in the memory cells in the second row to which data to be searched '101' has not been written, even when the conducting states of the transistors change owing to a change in the potential of the data line, not all the second transistors arranged in the direction in which the word line WL_2 is extended are brought into the conducting state. Consequently, the potential of the output signal line Sout_2 does not change.

In other words, when there is data to be searched, the address of data to be searched can be specified by inputting, through the data line, a potential obtained by inverting the potential of data to be searched and detecting conduction between the output signal line and the power supply line.

In the subsequent data output period T3, while the potentials of the output signal lines in the period T2 are retained with latch circuits or the like, the addresses of memory cells in which data corresponding to the output signal line that has been brought into conduction is stored are output to an external circuit from the determination circuit 102. Note that the determination circuit 102 may be configured to detect the address of an output signal with a demultiplexer circuit or the like.

As described above, high-speed search of data written to memory cells can be achieved by changing the potential of the data line.

This embodiment can be implemented in appropriate combination with the above embodiment.

Embodiment 3

This embodiment shows a plurality of modes of the structure of the second transistor in the reference circuit described in Embodiment 1.

As described in the above embodiment, detection of the conducting state or nonconducting state of the second transistor enables high-speed data search. Therefore, unlike a semiconductor layer in the first transistor, a semiconductor layer in the second transistor can be formed using various materials.

Figure 6A:
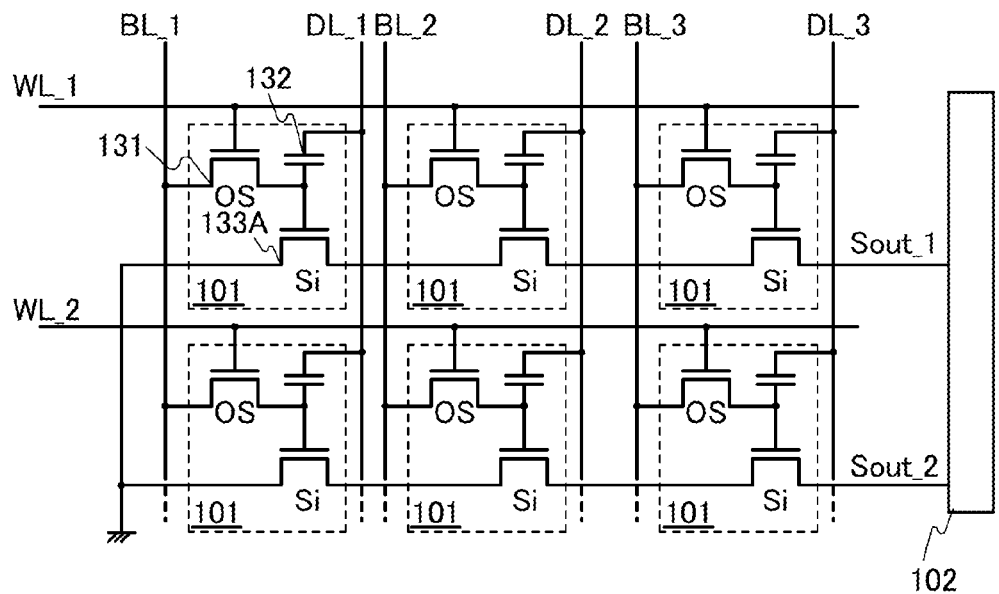
FIGS. 6A and 6B are circuit diagrams illustrating an example of a semiconductor memory device.

For example, like FIG. 1A, FIG. 6A is a circuit diagram illustrating a configuration of a memory cell. FIG. 6A illustrates a first transistor 131, a capacitor 132, and a second transistor 133A. A semiconductor layer in the second transistor 133A can be formed using silicon.

Note that silicon for the semiconductor layer can be microcrystalline silicon, polycrystalline silicon, single crystal silicon, or the like. Note that in FIG. 6A, the second transistor 133A is represented by "Si" so that it is regarded as a transistor whose channel is formed in a semiconductor layer containing silicon.

Moreover, in one embodiment of the present invention, by forming the second transistor 133A whose semiconductor layer is formed using silicon and the first transistor 131 whose semiconductor layer is an oxide semiconductor layer so that they form a layered structure, high density of the memory cells can be achieved.

Figure 6B:
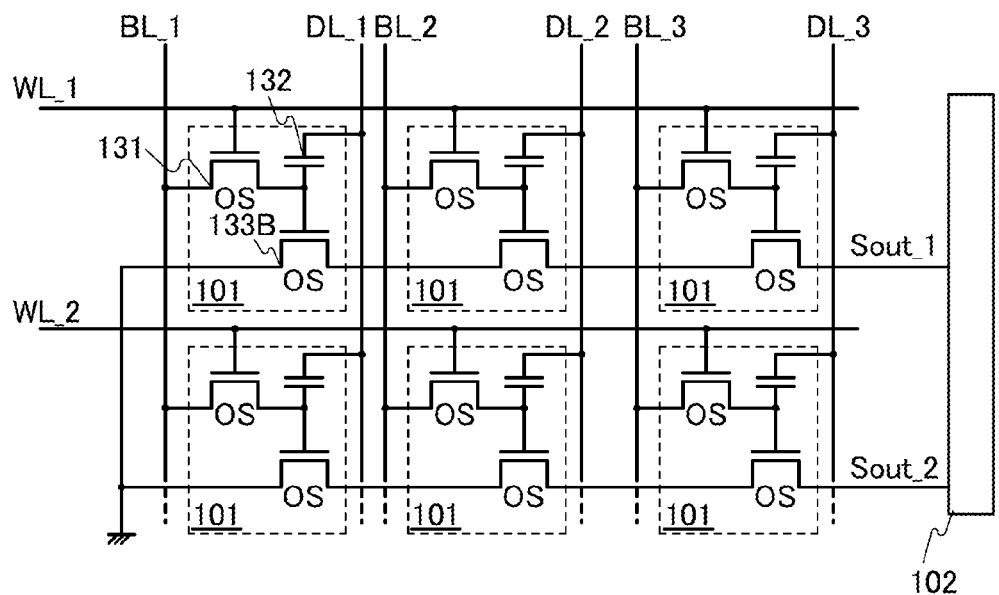

Another structure will be shown. Like FIG. 1A, FIG. 6B is a circuit diagram illustrating a configuration of a memory cell. FIG. 6B illustrates a first transistor 131, a capaciator 132, and a second transistor 133B. A semiconductor layer in the second transistor 133B can be formed using an oxide semiconductor.

Note that in FIG. 6B, the second transistor 133B is represented by "OS" like the first transistor 131 so that it is regarded as a transistor whose channel is formed in a semiconductor layer containing an oxide semiconductor.

Moreover, in one embodiment of the present invention, by forming the second transistor 133B whose semiconductor layer is formed using an oxide semiconductor and the first transistor 131 whose semiconductor layer is an oxide semiconductor layer so that they form a layered structure, high density of the memory cells can be achieved. Further, in the case of the structure in FIG. 6B, the first transistor 131 and the second transistor 133B are formed in the same manufacturing process, so that manufacturing cost can be reduced.

As described above, the structure of the second transistor can be in various modes.

This embodiment can be implemented in appropriate combination with any of the above embodiments.

Embodiment 4

This embodiment shows a configuration of a CPU in which a CAM, a semiconductor memory device according to one embodiment of the present invention, can be used.

Figure 7:
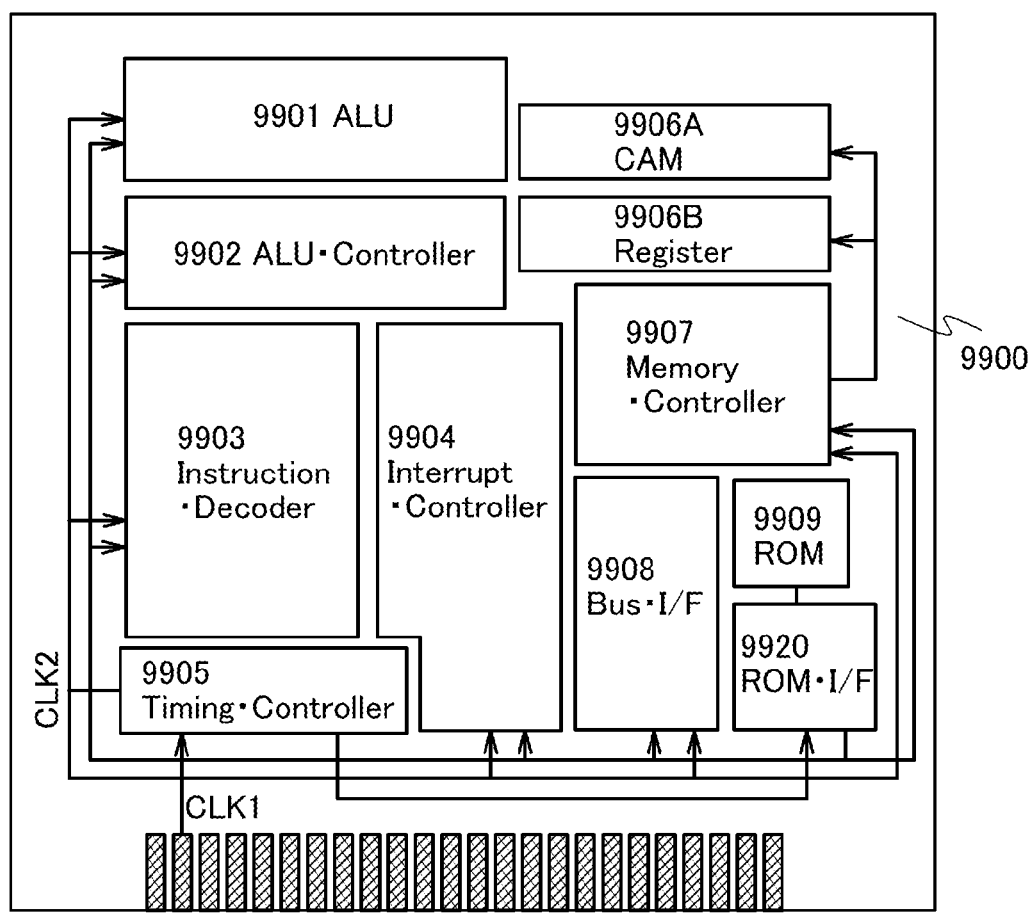
FIG. 7 is a block diagram of a CPU in which a semiconductor memory device is used.

FIG. 7 illustrates a configuration of the CPU in this embodiment. The CPU illustrated in FIG. 7 mainly includes an arithmetic logic unit (ALU) 9901, an ALU controller 9902, an instruction decoder 9903, an interrupt controller 9904, a timing controller 9905, a content addressable memory (CAM) 9906A, a register 9906B, a memory controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 7 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the memory controller 9907, and the timing controller 9905.

The ALU controller 9902, the interrupt controller 9904, the memory controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The memory controller 9907 generates addresses for the CAM 9906A and the register 9906B, and reads/writes data from/to the CAM 9906A and the register 9906B in accordance with the state of the CPU.

The timing controller 9905 generates signals for controlling operation timings of the ALU 9901, the ALU controller

9902, the instruction decoder 9903, the interrupt controller 9904, and the memory controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, a semiconductor memory device with the structure described in any of the above embodiments is provided in the CAM 9906A. The memory controller 9907 determines, in response to an instruction from the ALU 9901, whether a data signal is held in the semiconductor memory device which is the CAM 9906A.

Note that even in the case where the operation of the CPU is temporarily stopped and the supply of the supply voltage is stopped, a data signal can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing unit according to one embodiment of the present invention is not limited to the CPU and can be applied to an LSI such as a microprocessor, an image processing circuit, a digital signal processor (DSP), or a field programmable gate array (FPGA).

This embodiment can be implemented in combination with any of the above embodiments.

Embodiment 5

A manufacturing method of the semiconductor memory device will be described. Manufacturing methods of the second transistor 133A whose channel is formed in silicon, the first transistor 131 whose channel is formed in an oxide semiconductor layer, and the capaciator 132 will be described as examples for the explanation of the manufacturing method of the semiconductor memory device.

Figure 8A:
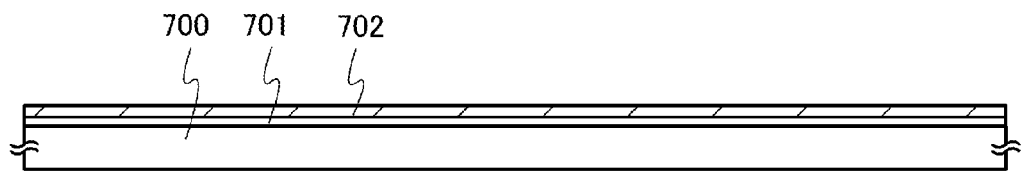
FIGS. 8A to 8D illustrate a process for manufacturing a semiconductor memory device.

As illustrated in FIG. 8A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is preferably used.

In this embodiment, an example in which the semiconductor film 702 is formed using single crystal silicon is given as a manufacturing method of the second transistor 133A. Note that a specific example of a forming method of the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the portion, which results in bonding of the entire surface where the bond substrate and the insulating film 701 are in close contact with each other. Subsequently, heat treatment is performed, whereby microvoids that exist in the fragile layer are combined, so that the microvoids increase in volume. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which has not been patterned or may be added to the semiconductor film 702 which is formed through the patterning. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which has not been patterned or the semiconductor film 702 which is formed through the patterning in order to finely control the threshold voltage.

Note that although an example in which the single crystal semiconductor film is used is described in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a heat-resistant substrate such as a quartz substrate, it is possible to combine any of the following crystallization methods: a thermal crystallization method using an electrically heated oven, a lamp annealing crystallization method using infrared light, a crystallization method using a catalytic element, and a high-temperature annealing method at approximately 950° C.

Figure 8B:
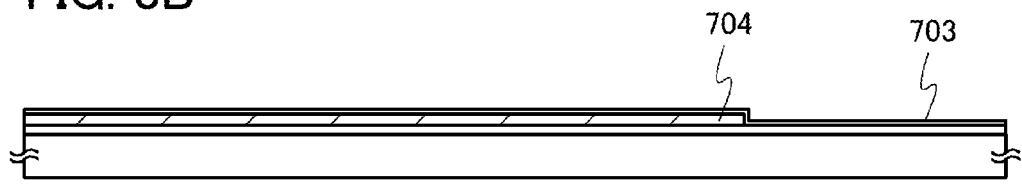

Next, as illustrated FIG. 8B, a semiconductor layer 704 is formed using the semiconductor film 702. Then, a gate insulating film 703 is formed over the semiconductor layer 704.

The gate insulating film 703 can be formed using, for example, a single layer or a stack of layers using silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added, or the like by a plasma CVD method, a sputtering method, or the like.

In this specification, in oxynitride, the amount of oxygen is larger than that of nitrogen, and in nitride oxide, the amount of nitrogen is larger than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma CVD method.

Figure 8C:
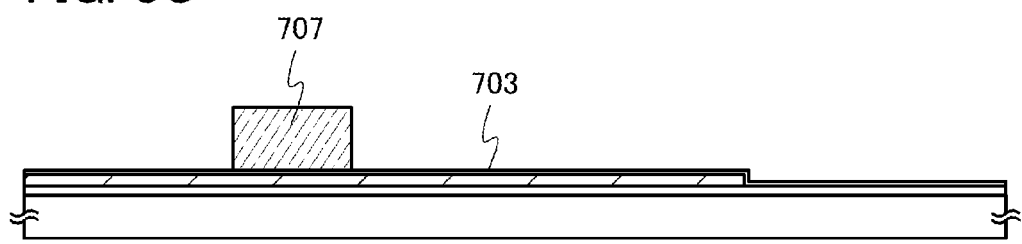

Next, a gate electrode 707 is formed as illustrated in FIG. 8C.

The gate electrode 707 can be formed in such a manner that a conductive film is formed, and then the conductive film is processed (patterned) into a desired shape. The conductive film can be formed by a CVD method, a sputtering method, an evaporation method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing any of the aforementioned metals as its main component or a compound containing any of the aforementioned metals may be used. Alternatively, the conductive film may be formed using a semiconductor such as polycrystalline silicon doped with an impurity element such as phosphorus which imparts conductivity to the semiconductor film.

Note that although the gate electrode 707 is formed of a single-layer conductive film in this embodiment, this embodiment is not limited to this structure. The gate electrode 707 may be formed of a plurality of stacked conductive films.

As a combination of two conductive films, tantalum nitride or tantalum can be used for a first conductive film and tungsten can be used for a second conductive film. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three conductive films are stacked, a layered structure of a molybdenum film, an aluminum film, and a molybdenum film is preferably used.

Further, a light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Alternatively, the gate electrode 707 may be selectively formed by a droplet discharge method without using a mask. A droplet discharge method is a method for forming a predetermined pattern by discharge or ejection of a droplet containing a predetermined composition from an orifice, and includes an inkjet method in its category.

The gate electrode 707 can be formed in such a manner that the conductive film is etched into a desired tapered shape by an inductively coupled plasma (ICP) etching method in which the etching condition (e.g., the amount of electric power applied to a coil-shaped electrode layer, the amount of electric power applied to an electrode layer on the substrate side, and the electrode temperature on the substrate side) is controlled as appropriate. In addition, angles and the like of the tapered shapes may also be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 8D:
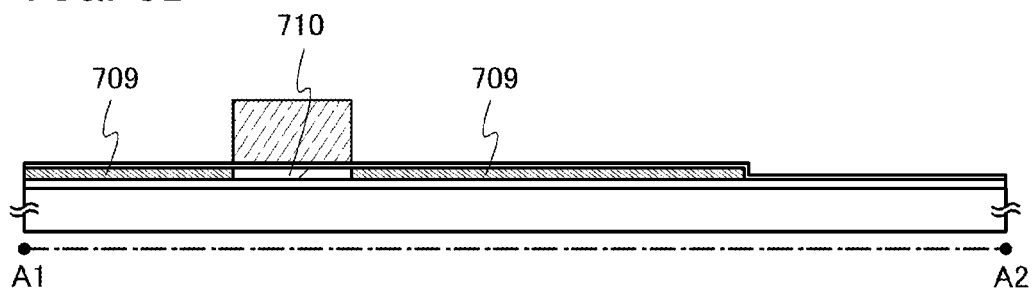

Next, an impurity element imparting one conductivity type is added to the semiconductor layer 704 with the use of the gate electrode 707 as a mask, whereby a channel formation region 710 which overlaps with the gate electrode 707 and a pair of impurity regions 709 with the channel formation region 710 interposed therebetween are formed in the semiconductor layer 704 as illustrated in FIG. 8D.

In this embodiment, the case where an impurity element imparting p-type conductivity (e.g., boron) is added to the semiconductor layer 704 is described as an example.

Figure 9A:
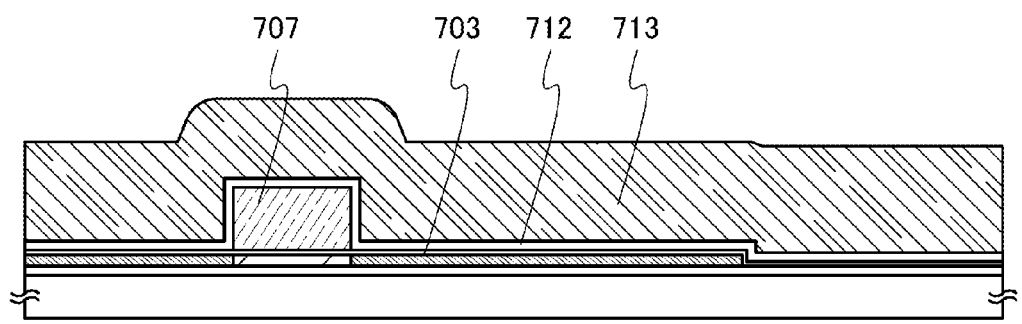
FIGS. 9A to 9C are diagrams illustrating the process for manufacturing a semiconductor memory device.

Next, as illustrated in FIG. 9A, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, a material with a low dielectric constant (a low-k material) is preferably used for the insulating films 712 and 713, because capacitance due to overlap of electrodes or wirings can be sufficiently reduced. Note that a porous insulating film including such a material may be employed as the insulating films 712 and 713. A porous insulating film has a lower dielectric constant than an insulating film with high density, and thus allows a further reduction in parasitic capacitance generated by electrodes or wirings.

In this embodiment, an example in which silicon oxynitride is used for the insulating film 712 and silicon nitride oxide is used for the insulating film 713 is described. In addition, an example in which the insulating films 712 and 713 are formed over the gate electrode 707 is described in this embodiment; however, in the present invention, only one insulating film may be formed over the gate electrode 707 or a plurality of insulating films of three or more layers may be stacked.

Figure 9B:
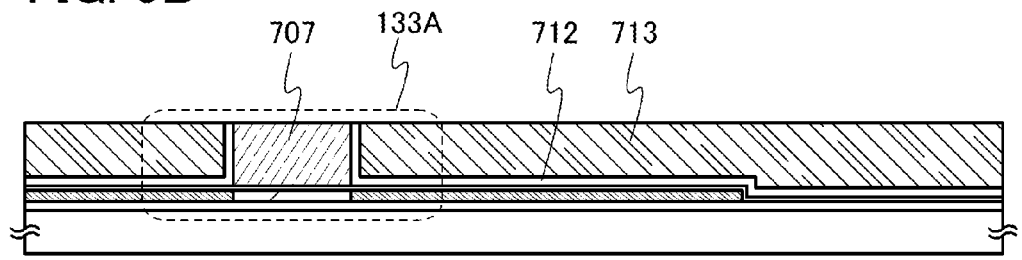

Next, as illustrated in FIG. 9B, the insulating film 713 is subjected to chemical mechanical polishing (CMP) or etching, so that a surface of the gate electrode 707 is exposed. Note that in order to improve the characteristics of the first transistor 131 which is formed later, a surface of the insulating film 713 is preferably planarized as much as possible.

Through the above steps, the second transistor 133A can be formed.

Figure 9C:
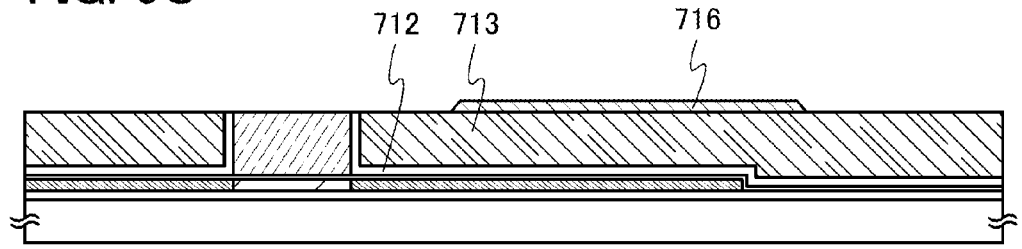

Next, a method for manufacturing the first transistor 131 is described. First, as illustrated in FIG. 9C, an oxide semiconductor layer 716 is formed over the insulating film 713.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

In the case where the oxide semiconductor layer 716 is formed by a sputtering method, water and hydrogen in a deposition chamber are made as little as possible in advance. Specifically, it is preferable, for example, to heat the inside of the deposition chamber before deposition, to reduce the concentration of water and/or hydrogen in a gas introduced into the deposition chamber, and to prevent a gas exhausted from the deposition chamber from flowing back into the deposition chamber.

Note that before the oxide semiconductor film is formed by a sputtering method, dust on a surface of the insulating film 713 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As described above, the oxide semiconductor film can be formed using any of the following: a four-component metal oxide such as an In—Sn—Ga—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; indium oxide; tin oxide; zinc oxide; and the like.

Note that the use of an In—Sn—Zn-based oxide semiconductor can increase the mobility of the transistor. Further, the use of an In—Sn—Zn-based oxide semiconductor allows the threshold voltage of the transistor to be stably controlled. In the case where an In—Sn—Zn-based oxide semiconductor is used, a target may have a composition ratio of In:Sn:Zn=1:2:2, In:Sn:Zn=2:1:3, or In:Sn:Zn=1:1:1 in an atomic ratio, for example.

In this embodiment, as the oxide semiconductor film, an In—Ga—Zn-based oxide semiconductor thin film with a thickness of 30 nm, which is obtained by a sputtering method using a target containing indium (In), gallium (Ga), and zinc (Zn), is used. As the target, a target having a composition ratio of In:Ga:Zn=1:1:0.5, In:Ga:Zn=1:1:1, or In:Ga:Zn=1:1:2 can be used, for example. The filling rate of the target containing In, Ga, and Zn is greater than or equal to 90% and less than or equal to 100%, preferably greater than or equal to 95% and less than 100%. With the use of the target with high filling rate, a dense oxide semiconductor film is formed.

In this embodiment, the oxide semiconductor film is formed in such a manner that the substrate is held in a treatment chamber kept at reduced pressure, a sputtering gas from which hydrogen and moisture are removed is introduced into the treatment chamber while remaining moisture therein is removed, and the above target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

As one example of the film formation condition, the distance between the substrate and the target is 100 mm, the pressure is 0.6 Pa, the electric power of the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

When the leakage rate of the treatment chamber of the sputtering apparatus is set to $1\times10^{-10}$ Pa·m$^3$/s or less, entry of impurities such as an alkali metal and hydride into the oxide semiconductor film that is being deposited by sputtering can be reduced. Further, with the use of the above entrapment vacuum pump as an evacuation system, counter flow of impurities such as alkali metal, a hydrogen atom, a hydrogen molecule, water, a hydroxyl group, and hydride from the evacuation system can be reduced.

When the purity of the target is set to 99.99% or higher, alkali metal, a hydrogen atom, a hydrogen molecule, water, a hydroxyl group, hydride, or the like entering the oxide semiconductor film can be reduced. In addition, when the target is used, the concentration of alkali metal such as lithium, sodium, or potassium can be reduced in the oxide semiconductor film.

In order that the oxide semiconductor film may contain as little hydrogen, a hydroxyl group, and moisture as possible, it is preferable that impurities adsorbed on the substrate 700, such as moisture and hydrogen, be eliminated and removed by preheating the substrate 700, over which films up to the insulating films 712 and 713 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that this preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coiled electrode, the amount of electric power applied to an electrode on the substrate side, the electrode temperature on the substrate side, or the like) is adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step to remove a resist residue or the like left over surfaces of the oxide semiconductor layer 716 and the insulating films 712 and 713.

Note that, in some cases, the oxide semiconductor film formed by sputtering or the like contains a large amount of moisture or hydrogen (including a hydroxyl group) as impurities. Moisture and hydrogen easily form a donor level and thus serve as impurities in the oxide semiconductor. Therefore, in one embodiment of the present invention, in order to reduce impurities such as moisture and hydrogen in the oxide semiconductor film (dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may include a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

Note that it is preferable that in the heat treatment, moisture, hydrogen, or the like be not contained in nitrogen or a rare gas such as helium, neon, or argon. It is preferable that the purity of nitrogen or a rare gas such as helium, neon, or argon which is introduced into the heat treatment apparatus be set to be 6N (99.9999%) or higher, preferably 7N (99.99999%) or higher (that is, the impurity concentration is 1 ppm or less, preferably 0.1 ppm or less).

It has been pointed out that an oxide semiconductor is insensitive to impurities, there is no problem even when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, this is not a proper consideration. Alkali metal is not an element included in an oxide semiconductor, and therefore, is an impurity. Also, alkaline-earth metal is an impurity in the case where alkaline-earth metal is not an element included in an oxide semiconductor. Alkali metal, in particular, Na becomes $Na^+$ when an insulating film in contact with the oxide semiconductor layer is an oxide and Na diffuses into the insulating film. Further, in the oxide semiconductor layer, Na cuts or enters a bond between metal and oxygen which are included in the oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor layer is less than or equal to $1 \times 10^{18}$ atoms/cm$^3$, preferably less than or equal to $1 \times 10^{17}$ atoms/cm$^3$, the concentration of the above impurity is preferably reduced. Specifically, the Na concentration measured by secondary ion mass spectrometry is preferably less than or equal to $5 \times 10^{16}$ atoms/cm$^3$, more preferably less than or equal to $1 \times 10^{16}$ atoms/cm$^3$, still more preferably less than or equal to $1 \times 10^{15}$ atoms/cm$^3$. In a similar manner, the measurement value of Li concentration is preferably less than or equal to $5 \times 10^{15}$ atoms/cm$^3$, more preferably less than or equal to $1 \times 10^{15}$ atoms/cm$^3$. In a similar manner, the measurement value of K concentration is preferably less than or equal to $5 \times 10^{15}$ atoms/cm$^3$, more preferably less than or equal to $1 \times 10^{15}$ atoms/cm$^3$.

Through the above steps, the hydrogen concentration in the oxide semiconductor layer 716 can be reduced and the oxide semiconductor layer 716 can be purified. Accordingly, the oxide semiconductor layer can be stable. In addition, heat treatment at a temperature lower than or equal to the glass transition temperature makes it possible to form an oxide semiconductor layer with a wide band gap. Therefore, the transistor can be manufactured using a large-sized substrate, so that the productivity can be increased. The above heat treatment can be performed at any time as long as it is performed after the oxide semiconductor layer is formed.

Note that the oxide semiconductor layer is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between the amorphous part and a crystal part in the CAAC-oxide semiconductor film is not clear. Further, with the TEM, a grain boundary in the CAAC-oxide semiconductor film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where an oxide semiconductor film is formed on one surface and crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

In the case of a transistor using a CAAC-OS film, changes in electric characteristics due to visible light or ultraviolet light irradiation can be reduced. Therefore, the transistor has high reliability.

Sputtering may be performed to form a CAAC-OS film. In order to obtain a CAAC-OS film by sputtering, it is important to form hexagonal crystals in an initial stage of deposition of an oxide semiconductor and cause crystal growth from the hexagonal crystals as seeds. In order to achieve this, it is preferable that the distance between the target and the substrate be made longer (e.g., 150 mm to 200 mm) and the substrate heating temperature be 100° C. to 500° C., more preferably 200° C. to 400° C., still preferably 250° C. to 300° C.

The proportion of oxygen gas in an atmosphere is preferably set high when a CAAC-OS film is formed by sputtering. For sputtering in a mixed gas atmosphere of argon and oxygen, for example, the proportion of oxygen gas is preferably set 30% or higher, more preferably 40% or higher. This is because supply of oxygen from the atmosphere promotes crystallization of the CAAC-OS film.

When a CAAC-OS film is formed by a sputtering method, a substrate over which a CAAC-OS film is heated preferably to 150° C. or higher, more preferably to 170° C. or higher. This is because a rise in substrate temperature promotes crystallization of the CAAC-OS film.

After being subjected to heat treatment in a nitrogen atmosphere or in vacuum, the CAAC-OS film is preferably subjected to heat treatment in an oxygen atmosphere or a mixed atmosphere of oxygen and another gas. This is because oxygen deficiency due to the former heat treatment can be compensated by supply of oxygen from the atmosphere in the latter heat treatment.

A film surface where the CAAC-OS film (deposition surface) is formed is preferably planar. This is because irregularity of the deposition surface provides grain boundaries in the CAAC-OS film because the c-axis substantially perpendicular to the deposition surface exists in the CAAC-OS film. For this reason, the deposition surface is preferably subjected to planarization treatment such as chemical mechanical polishing (CMP) before the CAAC-OS film is formed. The average roughness of the deposition surface is preferably 0.5 nm or less, more preferably 0.3 nm or less.

The CAAC-OS film will be described in detail with reference to FIGS. 12A to 12E, FIGS. 13A to 13C, and FIGS. 14A to 14C. In FIGS. 12A to 12E, FIGS. 13A to 13C, and FIGS. 14A to 14C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 12A to 12E, O surrounded by a circle represents tetracoordinate O and O surrounded by a double circle represents tricoordinate O.

Figure 12A:
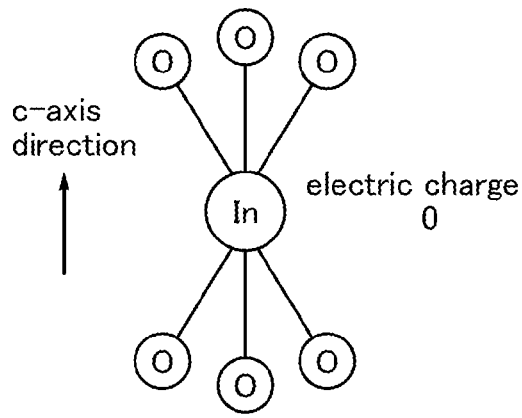
FIGS. 12A to 12E are diagrams illustrating structures of oxide materials according to one embodiment of the present invention.

FIG. 12A illustrates a structure including one hexacoordinate In atom and six tetracoordinate oxygen (hereinafter referred to as tetracoordinate O) atoms proximate to the In atom. Here, a structure including one In atom and oxygen atoms proximate thereto is referred to as a subunit. The structure in FIG. 12A is actually an octahedral structure, but is illustrated as a planar structure for simplicity. Note that three tetracoordinate O atoms exist in each of an upper half and a lower half in FIG. 12A. In the subunit illustrated in FIG. 12A, electric charge is 0.

Figure 12D:
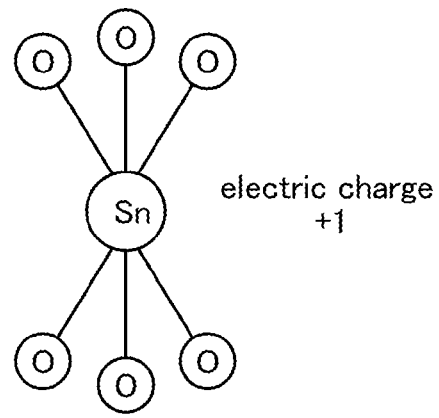
Figure 12B:
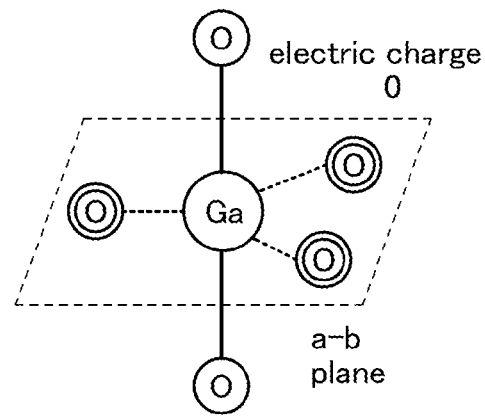

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the subunit illustrated in FIG. 12B, electric charge is 0.

Figure 12E:
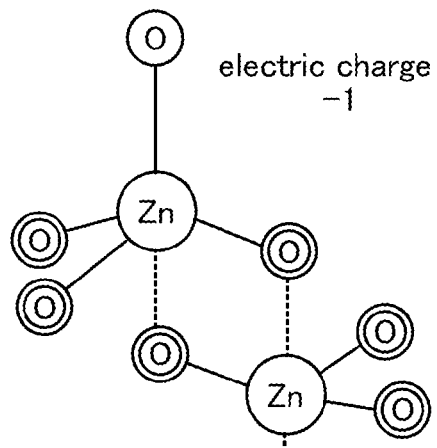
Figure 12C:
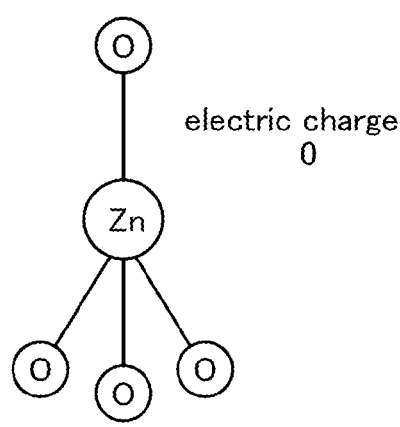

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half In the subunit illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half In the subunit illustrated in FIG. 12D, electric charge is +1.

FIG. 12E illustrates a subunit including two Zn atoms. In FIG. 12E, one tetracoordinate O atom exists in each of an upper half and a lower half In the subunit illustrated in FIG. 12E, electric charge is −1.

Here, a group of some subunits is called one group, and an assembly of a plurality of groups is called one unit.

Now, a rule of bonding between the subunits will be described. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, one group can be formed in a different manner by combining subunits so that the total electric charge of the layered structure is 0.

Figure 13A:
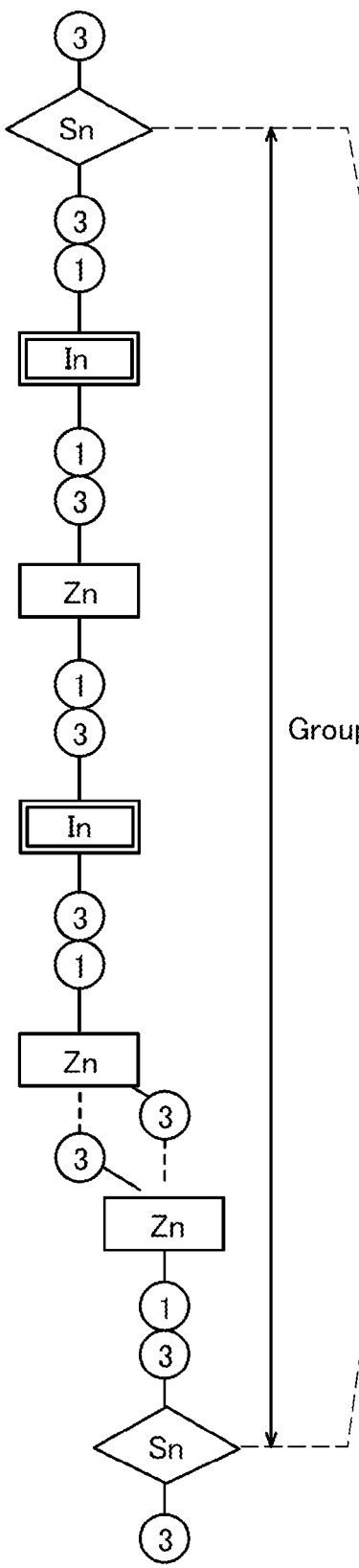
FIGS. 13A to 13C are diagrams each illustrating a structure of an oxide material according to one embodiment of the present invention.
Figure 13B:
Figure 13C:

FIG. 13A illustrates a model of one group included in a layered structure of an In—Sn—Zn—O-based material. FIG. 13B illustrates a unit including three groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups bonded to one another forms a unit.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 12E can be given. For example, with one subunit including two Zn atoms, electric charge of one subunit including a Sn atom can be cancelled, so that the total electric charge of the layered structure can be 0.

Specifically, repeated units each of which is illustrated in FIG. 13B can form an In—Sn—Zn—O-based crystal ($In_2SnZn_3O_8$). Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, or a Sn—Al—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based material; and the like.

Figure 14A:
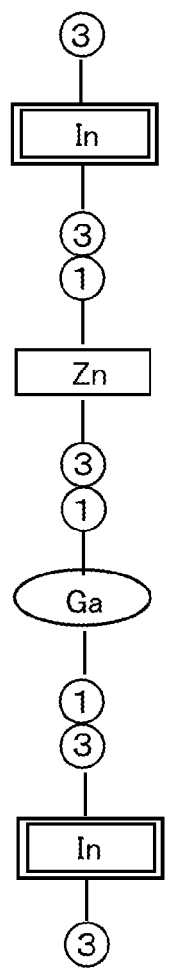
FIGS. 14A to 14C are diagrams each illustrating a structure of an oxide material according to one embodiment of the present invention.

As an example, FIG. 14A illustrates a model of one group included in a layered structure of an In—Ga—Zn—O-based material.

In the a group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups bonded to one another forms a unit.

Figure 14B:
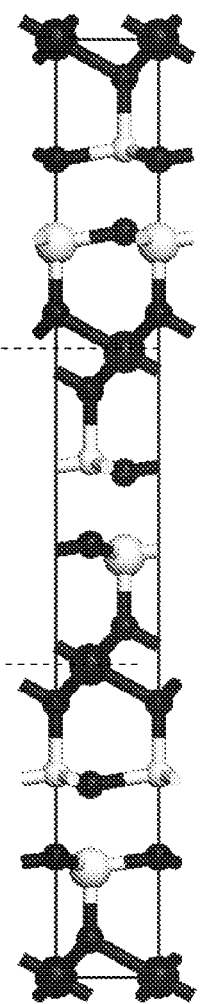
Figure 14C:
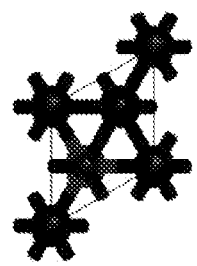

FIG. 14B illustrates a unit including three groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, and a Ga atom is 0. As a result, the total electric charge of the group having a combination of such subunits is always 0.

In order to form the layered structure of the In—Ga—Zn—O-based material, a unit can be formed using not only the group illustrated in FIG. 14A but also a unit in which the arrangement of the In atom, the Ga atom, and the Zn atom is different from that in FIG. 14A.

Figure 10A:
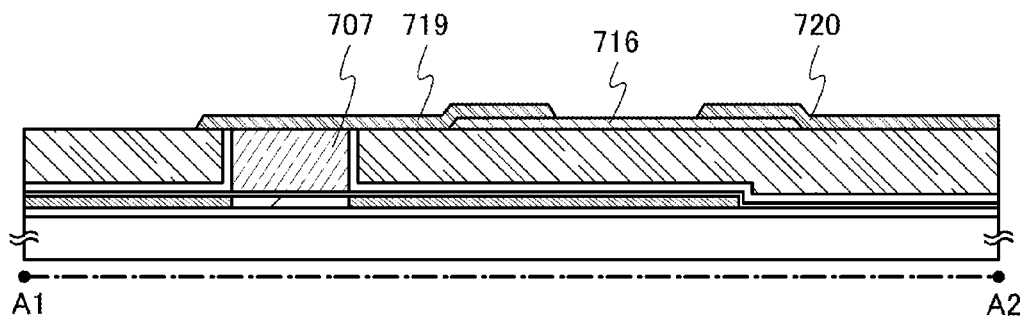
FIGS. 10A to 10C are diagrams illustrating the process for manufacturing a semiconductor memory device.

Then, as illustrated in FIG. 10A, the conductive film 719 which is in contact with the gate electrode 707 and the oxide semiconductor layer 716, and the conductive film 720 which is in contact with the oxide semiconductor layer 716 are formed. The conductive films 719 and 720 function as a source and drain electrodes.

Specifically, the conductive films 719 and 720 can be formed in such a manner that a conductive film is formed so as to cover the gate electrode 707 and the insulating film 713 by a sputtering method or a vacuum vapor deposition method and then is processed (patterned) into a predetermined shape.

As the conductive film which serves as the conductive films 719 and 720, any of the following materials can be used: an element selected from aluminum, chromium, copper, tantalum, titanium, molybdenum, or tungsten; an alloy containing any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film for forming the conductive films 719 and 720 may have a single-layer structure or a layered structure of two or more layers. For example, a single-layer structure of an aluminum film containing silicon; a two-layer structure of an aluminum film and a titanium film stacked thereover; a three-layer structure of a titanium film, an aluminum film stacked thereover, and a titanium film stacked thereover; and the like can be given. A Cu—Mg—Al alloy, a Mo—Ti alloy, Ti, and Mo have high adhesiveness with an oxide film. Therefore, when a layered structure is employed for the conductive films 719 and 720, in which a conductive film containing a Cu—Mg—Al alloy, a Mo—Ti alloy, Ti, or Mo is used for the lower layer and a conductive film containing Cu is used for the upper layer, the adhesion between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, indium oxide and tin oxide, indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor layer 716 is not removed as much as possible at the time of etching the conductive film. Depending on the etching conditions, an exposed portion of the oxide semiconductor layer 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

With provision of the oxide conductive film functioning as a source region and a drain region, resistance between the oxide semiconductor layer 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 10B:
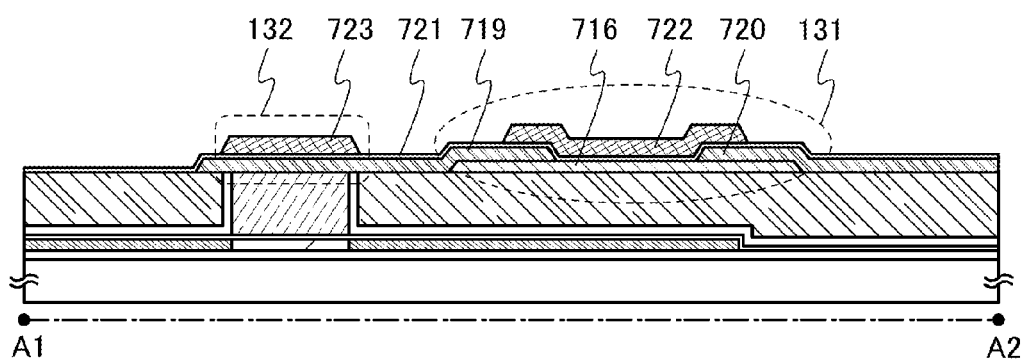

After the plasma treatment, as illustrated in FIG. 10B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the conductive film 719 so as to overlap with the conductive film 719.

The gate insulating film 721 can be formed using a material and a layered structure which are similar to those of the gate insulating film 703. Note that the gate insulating film 721 preferably contains impurities such as moisture or hydrogen as little as possible, and the gate insulating film 721 may be formed using a single-layer insulating film or a plurality of stacked insulating films. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, and/or the interface between the oxide semiconductor layer 716 and another insulating film and the vicinity thereof In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a silicon nitride film with a thickness of 100 nm formed by a sputtering method is stacked over a silicon oxide film with a thickness of 200 nm formed by a sputtering method is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas is 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive films 719 and 720 in a manner similar to that of the heat treatment performed on the oxide semiconductor layer for reduction of moisture or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition can be satisfied. It is preferable that the proportion of oxygen in the oxide semiconductor layer 716 be higher than that in the stoichiometric composition. As a result, the oxide semiconductor layer 716 can be made to be substantially i-type and variations in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor layer 716 can be made to be substantially i-type without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in such a manner that a conductive film is formed over the gate insulating film 721 and then is patterned. The gate electrode 722 and the conductive film 723 can be formed using a material and a layered structure which are similar to those of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film with a thickness of 150 nm for the gate electrode is formed by a sputtering method using a tungsten target, the conductive film is processed (patterned) into a desired shape by etching, whereby the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the first transistor 131 is formed.

Note that a portion where the conductive film 719 and the conductive film 723 overlap with each other with the gate insulating film 721 provided therebetween corresponds to the first capaciator 132.

Although the first transistor 131 is described as a single-gate transistor, a dual-gate or multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film in contact with the oxide semiconductor layer, an interface with the oxide semiconductor layer can keep a favorable state.

An insulating material containing an element that belongs to Group 13 refers to an insulating material containing one or more elements that belong to Group 13. As the insulating material containing an element that belongs to Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor layer containing gallium, a material containing gallium oxide may be used as an insulating film, so that favorable characteristics can be kept at the interface between the oxide semiconductor layer and the insulating film. When the oxide semiconductor layer and the insulating film containing gallium oxide are provided in contact with each other, pileup of hydrogen at the interface between the oxide semiconductor layer and the insulating film can be reduced, for example. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water to the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be set to be $Ga_2O_X$ (X=3+α, 0<α<1) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ (X=3+α, 0<α<1) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+α}$ (0<X<2, 0<α<1) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be made to be i-type or substantially i-type.

The oxide semiconductor layer, in which oxygen deficiency has been reduced by supplying excessive oxygen in the insulating film to the oxide semiconductor layer, is a highly purified oxide semiconductor layer in which hydrogen concentration is sufficiently reduced and defect level in the energy gap due to oxygen deficiency is reduced by sufficient supply of oxygen. Consequently, the oxide semiconductor layer carrier can be an oxide semiconductor layer in which carrier concentration is extremely low, which enables the transistor to have an extremely low off-state current. When such a transistor having an extremely low off-state current is used as the first transistor according to the above embodiment, the first transistor can be considered substantially as an insulator when being in the nonconductive state. Therefore, by using the first transistor in the memory circuit, a reduction in a potential held at a node connected to the capacitor and the first transistor can be reduced to an extremely low level. As a result, a nonvolatile memory circuit can be provided in which even if the supply of the supply potential is stopped, a change in the potential at the node N can be made small, so that stored data can be prevented from being lost.

The insulating film including a region where the proportion of oxygen is higher than that in the stoichiometric composition may be applied to either of the insulating films in contact with the oxide semiconductor layer 716: the insulating film placed on an upper side of the oxide semiconductor layer and the insulating film placed on a lower side of the oxide semiconductor layer; however, it is preferable to apply such an insulating film to both the insulating films in contact with the oxide semiconductor layer 716. The above effect can be enhanced with a structure where the oxide semiconductor layer 716 is provided between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed of gallium oxide whose composition is $Ga_2O_X$ (X=3+α, 0<α<1). Alternatively, one of the insulating films on the upper side and the lower side may be formed of $Ga_2O_X$ (X=3+α, 0<α<1) and the other may be formed of aluminum oxide whose composition is $Al_2O_X$ (X=3+α, 0<α<1).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ (X=3+α, 0<α<1) is formed and gallium aluminum oxide (aluminum gallium oxide) whose composition is $Ga_XAl_{2-X}O_{3+α}$ (0<X<2, 0<α<1) may be formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 10C:
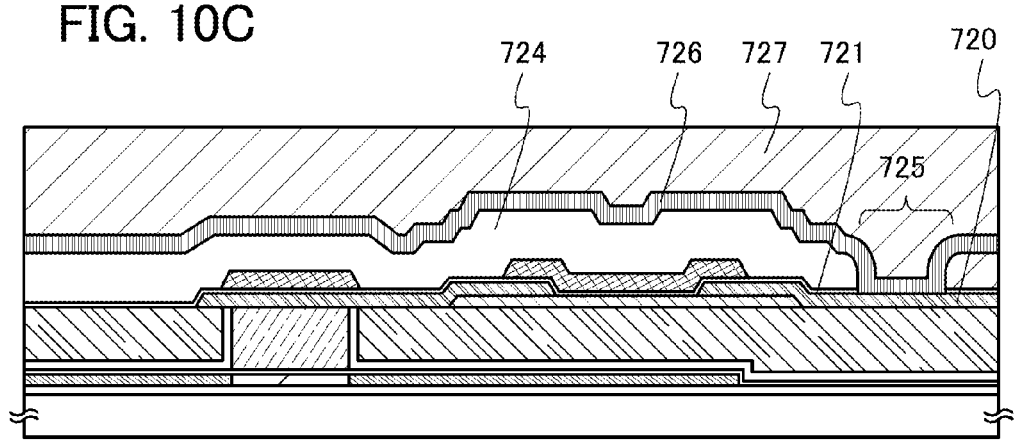

Next, as illustrated in FIG. 10C, an insulating film 724 is formed so as to cover the gate insulating film 721 and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by a PVD method or a CVD method and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material containing one of manganese, magnesium, zirconium, beryllium, neodymium, and scandium or a combination of any of these elements may be used.

Specifically, for example, it is possible to employ a method in which a thin titanium film (with a thickness of about 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

Here, the case where the conductive film 720 and the wiring 726 are connected to each other is described. In this case, an opening is formed in the gate insulating film 721 and the insulating film 724, and the wiring 726 is formed.

Next, an insulating film 727 is formed so as to cover the wiring 726. Through the series of steps, the semiconductor memory device can be manufactured.

Note that in the manufacturing method, the conductive films 719 and 720 functioning as source and drain electrodes are formed after the formation of the oxide semiconductor layer 716. Thus, as illustrated in FIG. 10B, in the first transistor 131 obtained by the manufacturing method, the conductive films 719 and 720 are formed over the oxide semiconductor layer 716. However, in the first transistor 131, the conductive films functioning as source and drain electrodes may be formed below the oxide semiconductor layer 716, that is, between the oxide semiconductor layer 716 and the insulating films 712 and 713.

Figure 11:
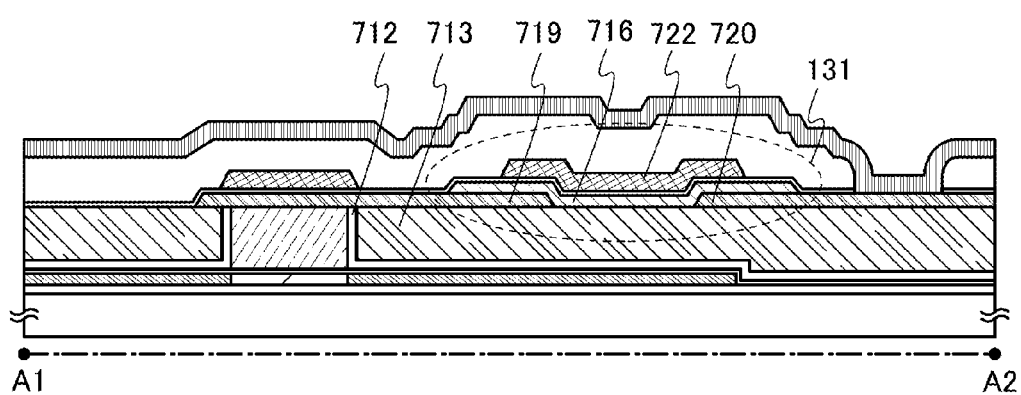
FIG. 11 is a cross-sectional view illustrating a structure of a semiconductor memory device.

FIG. 11 illustrates a cross-sectional view of the first transistor 131 at the time when the conductive films 719 and 720 functioning as source and drain electrodes are provided between the oxide semiconductor layer 716 and the insulating films 712 and 713. The first transistor 131 illustrated in FIG. 11 can be obtained in such a manner

| Spintronics (MTJ element) | OS/Si |
|---|---| that the conductive films 719 and 720 are formed after the formation of the insulating film 713, and then, the oxide semiconductor layer 716 is formed.

A magnetic tunnel junction element (an MTJ element) is generally known as a memory element used in a nonvolatile semiconductor memory device. The MTJ element is put in a low resistance state when the spin directions in films provided above and below an insulating film are parallel, and put in a high resistance state when the spin directions are not parallel, thereby storing data. Therefore, the semiconductor memory device including an oxide semiconductor in this embodiment has a principle that is completely different from that of the MTJ element. Table 1 shows comparison between the MTJ element and the semiconductor memory device according to this embodiment.

TABLE 1

| | Spintronics (MTJ element) | OS/Si |
|---|---|---|
| Heat Resistance | Curie temperature | Process temperature at 500° C. (reliability at 150° C.) |
| Driving Method | Current driving | Voltage driving |
| Writing Principle | Changing spin direction of magnetic body | Turning on/off FET |
| Si LSI | Suitable for bipolar LSI (MOS LSI is preferable for high integration because bipolar LSI is unsuitable for high integration. Note that W becomes larger.) | Suitable for MOS LSI |
| Overhead | Large (because of high Joule heat) | Smaller than overhead of the MTJ element by 2 to 3 or more orders of magnitude (because of charging and discharging of parasitic capacitance) |
| Nonvolatility | Utilizing spin | Utilizing low off-state current |
| Read Number | Without limitation | Without limitation |
| 3D Conversion | Difficult (at most two layers) | Easy (the number of layers is limitless) |
| Integration Degree ($F^2$) | 4 to 15 $F^2$ | Depends on the number of layers stacked in 3D conversion (it is necessary to ensure heat resistance in process of forming upper OS FET) |

TABLE 1-continued

| Material | Magnetic rare-earth element | OS material |
|---|---|---|
| Cost per Bit | High | Low (might be slightly high depending on OS material) |
| Resistance to Magnetic Field | Low | High |

The MTJ element is disadvantageous in that its magnetic properties are lost when the temperature is the Curie temperature or higher because it contains a magnetic material. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, though the MTJ element requires low write current.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that is sensitive to metal contamination. Further, the material cost per bit of the MTJ element is expensive.

On the other hand, the semiconductor memory device including an oxide semiconductor in this embodiment has an element structure and an operation principle which are similar to those of a silicon MOSFET except that the semiconductor material for the channel is a metal oxide. Further, the semiconductor memory device including an oxide semiconductor is not affected by a magnetic field, and does not cause soft errors. This shows that the transistor is highly compatible with a silicon integrated circuit.

This embodiment can be implemented in appropriate combination with any of the other embodiments.

This application is based on Japanese Patent Application serial no. 2011-101468 filed with Japan Patent Office on Apr. 28, 2011, the entire contents of which are hereby incorporated by reference.

What is claimed is:

1. A semiconductor device comprising:
a first memory cell comprising:
    a first transistor;
    a second transistor; and
    a first capacitor comprising one electrode electrically connected to one of a source and a drain of the first transistor and a gate of the second transistor;
a second memory cell comprising:
    a third transistor;
    a fourth transistor; and
    a second capacitor comprising an electrode electrically connected to one of a source and a drain of the third transistor and a gate of the fourth transistor; and
a circuit,
wherein:
    the first transistor comprises a semiconductor layer containing an oxide semiconductor;
    the third transistor comprises a semiconductor layer containing an oxide semiconductor;
    a gate of the first transistor and a gate of the third transistor are electrically connected to a first line;
    the other electrode of the first capacitor is electrically connected to a second line;
    the other electrode of the second capacitor is electrically connected to a third line;
    one of a source and a drain of the second transistor is electrically connected to one of a source and a drain of the fourth transistor; and
    the other of the source and the drain of the fourth transistor is electrically connected to the circuit.

2. The semiconductor device according to claim 1, wherein the second transistor comprises a semiconductor layer containing single crystal silicon.

3. The semiconductor device according to claim 2, wherein the first transistor is over the second transistor.

4. The semiconductor device according to claim 1, wherein the second transistor includes an oxide semiconductor layer.

5. The semiconductor device according to claim 4, wherein:
    the oxide semiconductor layer of the first transistor is formed on an insulating surface; and
    the oxide semiconductor layer of the second transistor is formed on the insulating surface.

6. The semiconductor device according to claim 1, wherein the circuit is a determination circuit being configured to detect a change in potential caused in accordance with conducting states or nonconducting states of the second transistor and the fourth transistor.

7. The semiconductor device according to claim 1, wherein concentration of hydrogen in the oxide semiconductor is $5\times10^{19}$ atoms/cm$^3$ or lower.

8. A semiconductor device comprising:
a first memory cell comprising:
    a first transistor;
    a second transistor; and
    a first capacitor comprising one electrode electrically connected to one of a source and a drain of the first transistor and a gate of the second transistor;
a second memory cell comprising:
    a third transistor;
    a fourth transistor; and
    a second capacitor comprising an electrode electrically connected to one of a source and a drain of the third transistor and a gate of the fourth transistor; and
a circuit,
wherein:
    the first transistor comprises a semiconductor layer containing an oxide semiconductor;
    the second transistor comprises a semiconductor layer containing silicon;
    the third transistor comprises a semiconductor layer containing an oxide semiconductor;
    the fourth transistor comprises a semiconductor layer containing silicon;
    a gate of the first transistor and a gate of the third transistor are electrically connected to a first line;
    the other electrode of the first capacitor is electrically connected to a second line;

the other electrode of the second capacitor is electrically connected to a third line;
one of a source and a drain of the second transistor is electrically connected to one of a source and a drain of the fourth transistor; and
the other of the source and the drain of the fourth transistor is electrically connected to the circuit.

9. The semiconductor device according to claim 8, wherein the first transistor is over the second transistor.

10. The semiconductor device according to claim 8, wherein the circuit is a determination circuit being configured to detect a change in potential caused in accordance with conducting states or nonconducting states of the second transistor and the fourth transistor.

11. The semiconductor device according to claim 8, wherein concentration of hydrogen in the oxide semiconductor is $5\times10^{19}$ atoms/cm$^3$ or lower.

12. A semiconductor device comprising:
a first memory cell comprising:
a first transistor;
a second transistor; and
a first capacitor comprising one electrode electrically connected to one of a source and a drain of the first transistor and a gate of the second transistor;
a second memory cell comprising:
a third transistor;
a fourth transistor; and
a second capacitor comprising an electrode electrically connected to one of a source and a drain of the third transistor and a gate of the fourth transistor; and
a circuit,
wherein:
the first transistor comprises a semiconductor layer containing an oxide semiconductor;
the third transistor comprises a semiconductor layer containing an oxide semiconductor;
a gate of the first transistor and a gate of the third transistor are electrically connected to a first line;
the other of the source and the drain of the first transistor is electrically connected to a second line;
the other of the source and the drain of the third transistor is electrically connected to a third line;
the other electrode of the first capacitor is electrically connected to a fourth line;
the other electrode of the second capacitor is electrically connected to a fifth line;
one of a source and a drain of the second transistor is electrically connected to one of a source and a drain of the fourth transistor; and
the other of the source and the drain of the fourth transistor is electrically connected to the circuit.

13. The semiconductor device according to claim 12, wherein the second transistor comprises a semiconductor layer containing single crystal silicon.

14. The semiconductor device according to claim 13, wherein the first transistor is over the second transistor.

15. The semiconductor device according to claim 12, wherein the second transistor includes an oxide semiconductor layer.

16. The semiconductor device according to claim 15, wherein:
the oxide semiconductor layer of the first transistor is formed on an insulating surface; and
the oxide semiconductor layer of the second transistor is formed on the insulating surface.

17. The semiconductor device according to claim 12, wherein the circuit is a determination circuit being configured to detect a change in potential caused in accordance with conducting states or nonconducting states of the second transistor and the fourth transistor.

18. The semiconductor device according to claim 12, wherein concentration of hydrogen in the oxide semiconductor is $5\times10^{19}$ atoms/cm$^3$ or lower.

* * * * *

UNITED STATES PATENT AND TRADEMARK OFFICE
CERTIFICATE OF CORRECTION

| | | |
|---|---|---|
| PATENT NO. | : 8,729,545 B2 | Page 1 of 1 |
| APPLICATION NO. | : 13/454437 | |
| DATED | : May 20, 2014 | |
| INVENTOR(S) | : Yasuyuki Takahashi | |

It is certified that error appears in the above-identified patent and that said Letters Patent is hereby corrected as shown below:

In the Specification

Column 4, lines 48-49, replace "capaciator" with --capacitor--;

Column 4, line 50, replace "capaciator" with --capacitor--;

Column 4, line 55, replace "capaciator" with --capacitor--;

Column 4, line 58, replace "capaciator" with --capacitor--;

Column 4, lines 62-63, replace "capaciator" with --capacitor--;

Column 4, line 64, replace "capaciator" with --capacitor--;

Column 5, line 2, replace "capaciator" with --capacitor--;

Column 10, line 9, replace "capaciator" with --capacitor--;

Column 10, line 42, replace "UF" with --I/F--;

Column 11, line 35, replace "capaciator" with --capacitor--;

Column 20, line 62, after "half" insert --.--;

Column 25, line 16, after "thereof" insert --.--;

Column 26, line 45, replace "capaciator" with --capacitor--.

Signed and Sealed this
Thirtieth Day of December, 2014

Michelle K. Lee
*Deputy Director of the United States Patent and Trademark Office*